United States Patent
Hornbuckle

(10) Patent No.: US 7,791,415 B2
(45) Date of Patent: Sep. 7, 2010

(54) FRACTIONAL-N SYNTHESIZED CHIRP GENERATOR

(75) Inventor: Craig A. Hornbuckle, Torrance, CA (US)

(73) Assignee: Semtech Corporation, Camarillo, CA (US)

(*) Notice: Subject to any disclaimer, the term of this patent is extended or adjusted under 35 U.S.C. 154(b) by 97 days.

(21) Appl. No.: 12/122,635

(22) Filed: May 16, 2008

(65) Prior Publication Data

US 2008/0284531 A1    Nov. 20, 2008

Related U.S. Application Data

(60) Provisional application No. 60/924,523, filed on May 18, 2007.

(51) Int. Cl.
 H03L 7/085  (2006.01)
 H03L 7/089  (2006.01)
(52) U.S. Cl. ............... 331/1 A; 331/16; 331/18; 331/34; 375/376
(58) Field of Classification Search ............ 331/1 A, 331/16, 18, 34; 375/376
 See application file for complete search history.

(56) References Cited

U.S. PATENT DOCUMENTS

| | | | |
|---|---|---|---|
| 6,294,936 B1 | 9/2001 | Clementi | |
| 7,389,095 B1* | 6/2008 | Liu et al. | 455/260 |
| 2002/0022465 A1* | 2/2002 | McCullagh et al. | 455/260 |
| 2005/0008113 A1* | 1/2005 | Kokubo et al. | 375/376 |
| 2005/0013343 A1 | 1/2005 | Giunco et al. | |
| 2005/0040893 A1* | 2/2005 | Paist et al. | 331/1 A |
| 2005/0077935 A1* | 4/2005 | Giuroiu | 327/156 |
| 2005/0213697 A1 | 9/2005 | Adachi et al. | |
| 2007/0236297 A1* | 10/2007 | Uozumi et al. | 331/16 |
| 2008/0042697 A1* | 2/2008 | Narathong et al. | 327/115 |
| 2008/0129351 A1* | 6/2008 | Chawla | 327/156 |

* cited by examiner

Primary Examiner—Arnold Kinkead
Assistant Examiner—Richard Tan
(74) Attorney, Agent, or Firm—McDermott Will & Emery LLP

(57) ABSTRACT

A fractional-N synthesized chirp generator includes a fractional-N synthesizer and a digital ramp synthesizer. The fractional-N synthesizer has a frequency synthesizer and a sigma-delta modulator module. The fractional-N synthesizer is configured to receive a reference frequency input signal and a frequency control value. The fractional-N synthesizer is configured to transform the reference frequency signal and the frequency control value to a chirped radio frequency (RF) output signal in a deterministic manner. The digital ramp synthesizer is configured to receive the reference frequency input signal and configured to generate the frequency control value utilizing the reference frequency input signal. The digital ramp synthesizer is further configured to provide the frequency control value to the fractional-N synthesizer. The frequency control value varies with time.

22 Claims, 7 Drawing Sheets

FRACTIONAL-N SYNTHESIZED CHIRP GENERATOR

CROSS-REFERENCES TO RELATED APPLICATIONS

The present application claims the benefit of priority under 35 U.S.C. §119 from U.S. Provisional Patent Application Ser. No. 60/924,523, entitled "FRACTIONAL-N SYNTHESIZED CHIRP GENERATOR," filed on May 18, 2007, which is hereby incorporated by reference in its entirety for all purposes.

BACKGROUND

1. Field

The subject technology relates generally to signal generation, and more specifically to fractional-N synthesized chirp generators.

2. Background

Modern radar systems often employ so-called chirped-FM waveforms in which the frequency of the transmitted signal is varied linearly between an upper and lower frequency at a rapid, and often times variable, rate of change with time. In such applications, it is important that the rate of change of the frequency be constant during an interval of up-chirp and/or down-chirp as inaccuracies in this parameter degrade the accuracy performance of the radar system as well as its sensitivity.

One approach to generating a chirped-FM waveform involves applying a voltage ramp to a low phase noise voltage controlled oscillator (VCO). This approach is limited by inherent nonlinearities in the frequency versus control voltage tuning curve of the VCO. Correction for this error term, while possible, is problematic. Another significant problem, and one that is less easily dealt with, is the frequency noise associated with the VCO. At low frequency offsets, the VCO's frequency noise power spectral density is typically quite poor, and this often degrades system performance. This problem is particularly acute in monolithic implementations where limitations on the achievable quality factor of on-chip passive structures results in much poorer VCO frequency and phase noise than that associated with off-chip circuits.

SUMMARY

According to one aspect of the subject technology, a fractional-N synthesized chirp generator comprises a fractional-N synthesizer and a digital ramp synthesizer. The fractional-N synthesizer is configured to receive a reference frequency input signal and a first frequency control value. The fractional-N synthesizer is configured to transform the reference frequency signal and the first frequency control value to a chirped radio frequency (RF) output signal in a deterministic manner.

The fractional-N synthesizer comprises a frequency synthesizer and a sigma-delta modulator module. The frequency synthesizer comprises a voltage controlled oscillator and a programmable frequency divider. The programmable frequency divider is configured to receive a second frequency control value.

The sigma-delta modulator module comprises a sigma-delta modulator and a summation block. The sigma-delta modulator is configured to receive one or more lower significant values of the first frequency control value and the reference frequency input signal. The sigma-delta modulator is configured to transform the one or more lower significant values of the frequency control value to a third frequency control value utilizing a pseudo-random sequence. The third frequency control value represents a fractional count value when averaged over a time window. The summation block is configured to add the third frequency control value and one or more most significant values of the first frequency control value. The summation block is configured to produce the second frequency control value having a frequency spectra content that is higher than a loop bandwidth defined by the frequency synthesizer.

The digital ramp synthesizer is configured to receive the reference frequency input signal and configured to generate the first frequency control value utilizing the reference frequency input signal. The digital ramp synthesizer is further configured to provide the first frequency control value to the fractional-N synthesizer. The first frequency control value varies with time.

The digital ramp synthesizer comprises a ramp synthesizer block and a ramp controller block. The ramp synthesizer block comprises an up-chirp ramp rate block configured to provide an up-chirp ramp rate and a down-chirp ramp rate block configured to provide a down-chirp ramp rate. The ramp synthesizer block further comprises a selector configured to select the up-chirp ramp rate or the down-chirp ramp rate based on a counter control value. The selector is configured to produce a frequency ramp control value. The ramp synthesizer block further comprises a frequency control value generation block configured to produce the first frequency control value utilizing the reference frequency input signal and the frequency ramp control value.

The ramp controller block comprises an upper frequency limit block configured to provide an upper frequency limit value and a lower frequency limit block configured to provide a lower frequency limit value. The ramp controller block further comprises a selector configured to select the upper frequency limit value or the lower frequency limit value based on a counter control value. The selector is configured to produce a frequency limit value. The ramp controller block further comprises a compare logic block configured to receive the frequency limit value and the first frequency control value. The compare logic block is configured to produce a counter control value.

According to one aspect of the subject technology, a fractional-N synthesized chirp generator comprises a fractional-N synthesizer and a digital ramp synthesizer. The fractional-N synthesizer comprises a frequency synthesizer and a sigma-delta modulator module. The fractional-N synthesizer is configured to receive a reference frequency input signal and a frequency control value. The fractional-N synthesizer is configured to transform the reference frequency signal and the frequency control value to a chirped radio frequency (RF) output signal in a deterministic manner.

The digital ramp synthesizer is configured to receive the reference frequency input signal and configured to generate the frequency control value utilizing the reference frequency input signal. The digital ramp synthesizer is further configured to provide the frequency control value to the fractional-N synthesizer. The frequency control value varies with time.

According to one aspect of the subject technology, a method is provided for generating a chirped radio frequency (RF) output signal. The method comprises receiving a reference frequency input signal, and generating a first frequency control value utilizing the reference frequency input signal. The first frequency control value varies with time.

The method further comprises generating a second frequency control value based on the first frequency control value. The second frequency control value includes a pseudo-random sequence. The second frequency control value has a frequency spectra content that is higher than a loop bandwidth defined by a frequency synthesizer. The frequency synthesizer comprises a voltage controlled oscillator. The voltage controlled oscillator does not follow an instantaneous value of the second frequency control value but rather follows a time-averaged value of the second frequency control value. The method further comprises generating a chirped radio frequency (RF) output signal utilizing the reference frequency input signal and the second frequency control value.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

According to one aspect, the subject technology can provide a highly accurate chirped-FM waveform, which may be realized with circuit elements in a fully-monolithic implementation. This approach utilizes fractional-N synthesizer technology operating off of a stable low-frequency reference clock supplied by an off-chip crystal oscillator.

Figure 1:
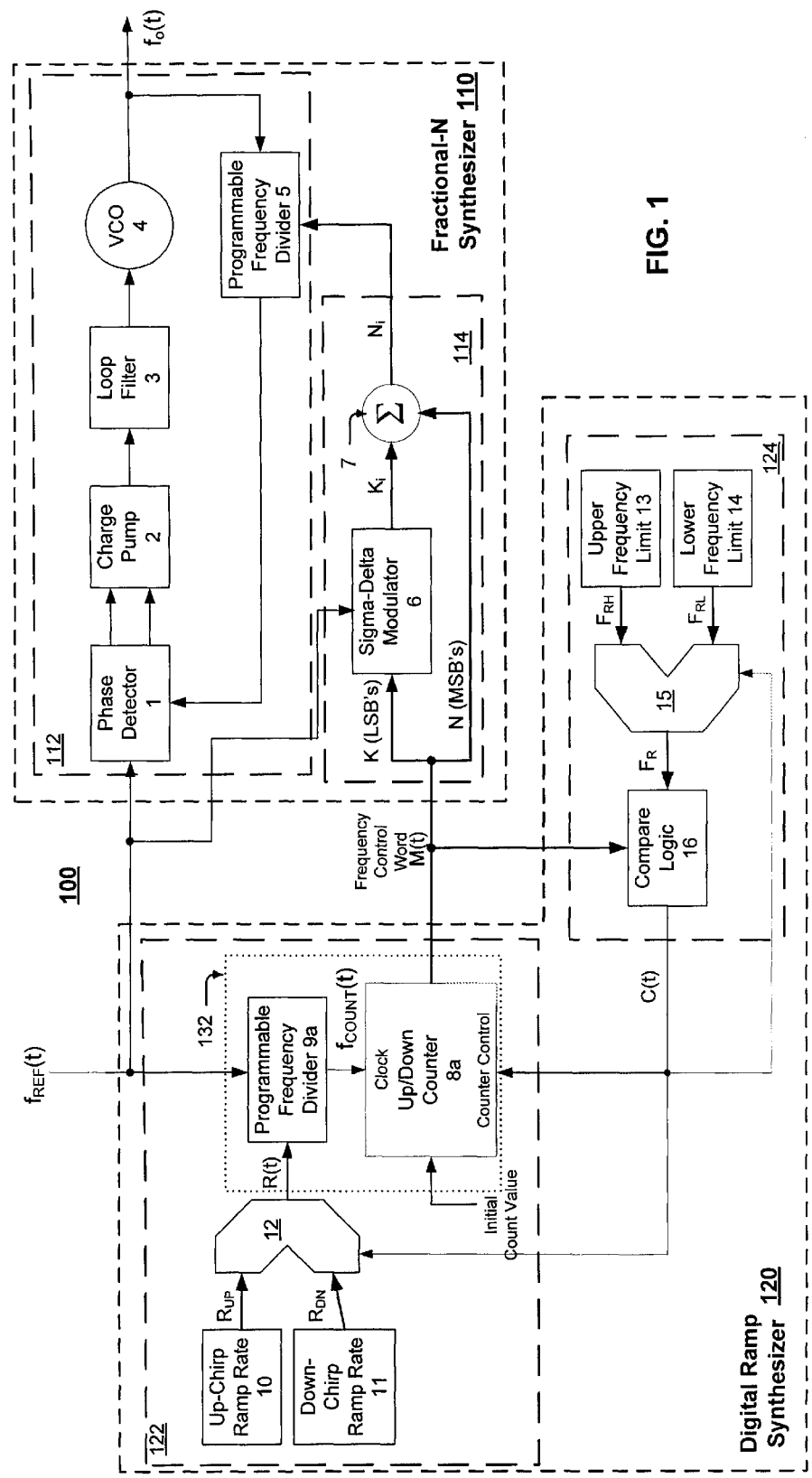
FIG. 1 is a diagram illustrating an example of a fractional-N synthesized chirp generator according to one aspect of the subject technology.

FIG. 1 is a diagram illustrating an example of a fractional-N synthesized chirp generator according to one aspect of the subject technology. A fractional-N synthesized chirp generator 100 can be fabricated as a monolithic circuit (e.g., a semiconductor integrated circuit) and can be included in a transceiver or a transmitter/receiver chipset, where each of a transceiver or transmitter/receiver chipset may be comprised of one or more integrated circuits. A fractional-N synthesized chirp generator 100 may include a fractional-N synthesizer 110 and a digital ramp synthesizer 120. A fractional-N synthesizer 110 may include a frequency synthesizer 112 and a sigma-delta modulator module 114. A frequency synthesizer 112 may be an integer-N frequency synthesizer. A digital ramp synthesizer 120 may include a ramp synthesizer block 122 and a ramp controller block 124.

A ramp synthesizer block 122 may generate a frequency control word M(t) (e.g., a binary word) whose value changes in a linear-step fashion with time. For instance, M(t) may be incremented by a count increment amount between two limits (e.g., an upper frequency limit value $F_{RH}$ and a lower frequency limit value $F_{RL}$). A ramp controller block 124 can set these upper and lower frequency limit values $F_{RH}$ and $F_{RL}$ and set the ramp synthesizer block 122 in a count-up mode (or a ramp-up mode) or a count-down mode (or a ramp-down mode). A fractional-N synthesizer 110 may translate a frequency control word M(t) to an output frequency $f_o(t)$ of a chirped radio frequency (RF) output signal in a deterministic manner.

A frequency synthesizer 112 may be a phaselock loop frequency synthesizer including a phase detector 1, a charge pump 2, a loop filter 3, a voltage controlled oscillator (VCO) 4, and a programmable frequency divider 5. A frequency synthesizer 112 may receive a reference frequency input signal having an input frequency $f_{REF}(t)$. The reference frequency input signal may be generated by an off-chip crystal oscillator. A frequency synthesizer 112 may produce a chirped radio frequency (RF) output signal having an output frequency $f_o(t)$, utilizing the reference frequency input signal, the phase detector 1, the charge pump 2, the loop filter 3, the voltage controlled oscillator (VCO) 4, and the programmable frequency divider 5. An input frequency $f_{REF}(t)$ may be frequency-scaled to output frequency $f_o(t)$. The relationship between an output frequency $f_o(t)$ and an input frequency $f_{REF}(t)$ may be expressed as follows:

$$f_o(t)=N*f_{REF}(t),$$

where N is an integer divide constant associated with the programmable frequency divider 5 (e.g., N may be $N_i$, which is described later). An input frequency $f_{REF}(t)$ may be received by a fractional-N synthesizer 110 and by a digital ramp synthesizer 120. More specifically, an input frequency $f_{REF}(t)$ may be received by a frequency synthesizer 112 or a phase detector 1, by a sigma-delta modulator module 114 or a sigma-delta modulator 6, and by a ramp synthesizer block 122 or a programmable frequency divider 9a.

A sigma-delta modulator module 114 may comprise a sigma-delta modulator 6 and a summation block 7. By including a sigma-delta modulator module 114, non-integer values of frequency multiplication may be realized. Lower significant bit(s) K of a frequency control word M(t) can be provided to the sigma-delta modulator 6. The sigma-delta modulator 6 can generate a fractional count value by realizing as a sequence of count values $K_i$. The summation block 7 can add the sequence of count values $K_i$ to the count value N, which includes the most significant bit(s) of the frequency control word M(t) to realize the ultimate frequency control word sequence denoted as $N_i$ in FIG. 1.

$K_i$ and $N_i$ may represent noise-shaped pseudo-random sequences whose mean value is fractional in nature resulting in an average value that is a non-integer count value. A sigma-delta modulator 6 can translate each K of the frequency control word M(t) into a plurality of unbalanced noise-shaped pseudo-random sequences $K_i$ having a pseudo-random frequency spectra content that is higher than a loop bandwidth defined by a frequency synthesizer. A sigma-delta modulator module 114 can translate each frequency control word M(t) into a plurality of unbalanced noise-shaped pseudo-random sequences $N_i$ having a frequency spectra content that is higher than a loop bandwidth defined by a frequency synthesizer.

As an exemplary illustration, assume that $f_{REF}(t)$ is about 16-20 MHz, and a loop bandwidth defined by a frequency synthesizer 112 is 100 kHz. A fractional-N synthesized chirp generator can produce an output signal with $f_o(t)$ having a noise that is outside the 100 kHz loop bandwidth. A fractional-N synthesized chirp generator can thus produce an output signal with $f_o(t)$ having low phase noise and low frequency noise values that are not impacted significantly by the pseudo-random sequence $N_i$ produced by the sigma-delta operation. An output signal may be also independent of a tuning curve of a voltage controlled oscillator (e.g., VCO 4).

A programmable frequency divider 5 may receive a plurality of unbalanced noise-shaped pseudo-random sequences $N_i$. For each value of M(t), a programmable frequency divider 5 may oscillate between a corresponding set of values consisting of the value $K_i$ added to the non-fractional component of the frequency control word, N resulting in bit sequence $N_i$. These values may be, for example, 220, 222, 224, and 226. It should be noted that the subject technology is not limited to any particular values or any particular number of values.

According to one aspect of the subject technology, since the frequency spectra of $N_i$ as applied to the programmable frequency divider 5 in FIG. 1 is higher than the frequency synthesizer's loop bandwidth, as defined by the circuit blocks 1, 2, 3, 4, and 5 of FIG. 1, a voltage controlled oscillator (VCO) 4 is configured to follow a time-averaged value of $N_i$, and VCO 4 is not configured to follow an instantaneous value of $N_i$. A response rate of VCO 4 is thus slower than a rate of change of the instantaneous value of $N_i$, as the loop bandwidth of the frequency synthesizer controlling the VCO 4 is considerably lower than the dominant spectrum of the sequence $N_i$.

To realize a chirped-FM waveform in which the frequency $f_o(t)$ of the output signal is ramped up and down at various desired ramp rates, the frequency control word M(t) may be varied in a linear manner. This may be accomplished by the up/down counter 8a, which is, for example, an up/down frequency counter. By counting up from a predetermined starting count value (i.e., an initial count value), at a predetermined clocking rate $f_{COUNT}(t)$, the frequency control word M(t) may be ramped up. A clocking rate $f_{COUNT}(t)$ is the frequency of the clock signal supplied to the up/down counter 8a (i.e., a counter clock frequency signal). If this is done at a rate that is sufficiently higher than the phaselock loop bandwidth, then the VCO 4 can ramp up in frequency at the desired rate. In this implementation, the phaselock loop (i.e., circuit blocks 1, 2, 3, 4, and 5) performs a tracking filter function. This suppresses frequency noise processes that are outside the loop bandwidth of the synthesizer phaselock loop, thereby suppressing the majority of the frequency noise induced by the spectrally-shaped sequence $N_i$ acting upon the programmable frequency divider 5 in FIG. 1.

By having a programmable frequency divider 9a, an up-chirp ramp rate block 10, a down-chirp ramp rate block 11, and a selector 12 in the ramp synthesizer block 122, the frequency ramp rate for the up-chirp and down-chirp periods may be made to be different. In this exemplary implementation, the up-chirp ramp rate block 10 and the down-chirp ramp rate block 11 contain values associated with the desired frequency ramp rates. The selector 12 is controlled by a counter control value C(t) (e.g., an up/down counter control bit value). The output of the selector 12 is a frequency ramp control word R(t) (sometimes referred to as a ramp rate) for the programmable frequency divider 9a. The frequency ramp control word R(t) may control not only the ramp rate but also the direction of the ramp (up or down).

Figure 2:
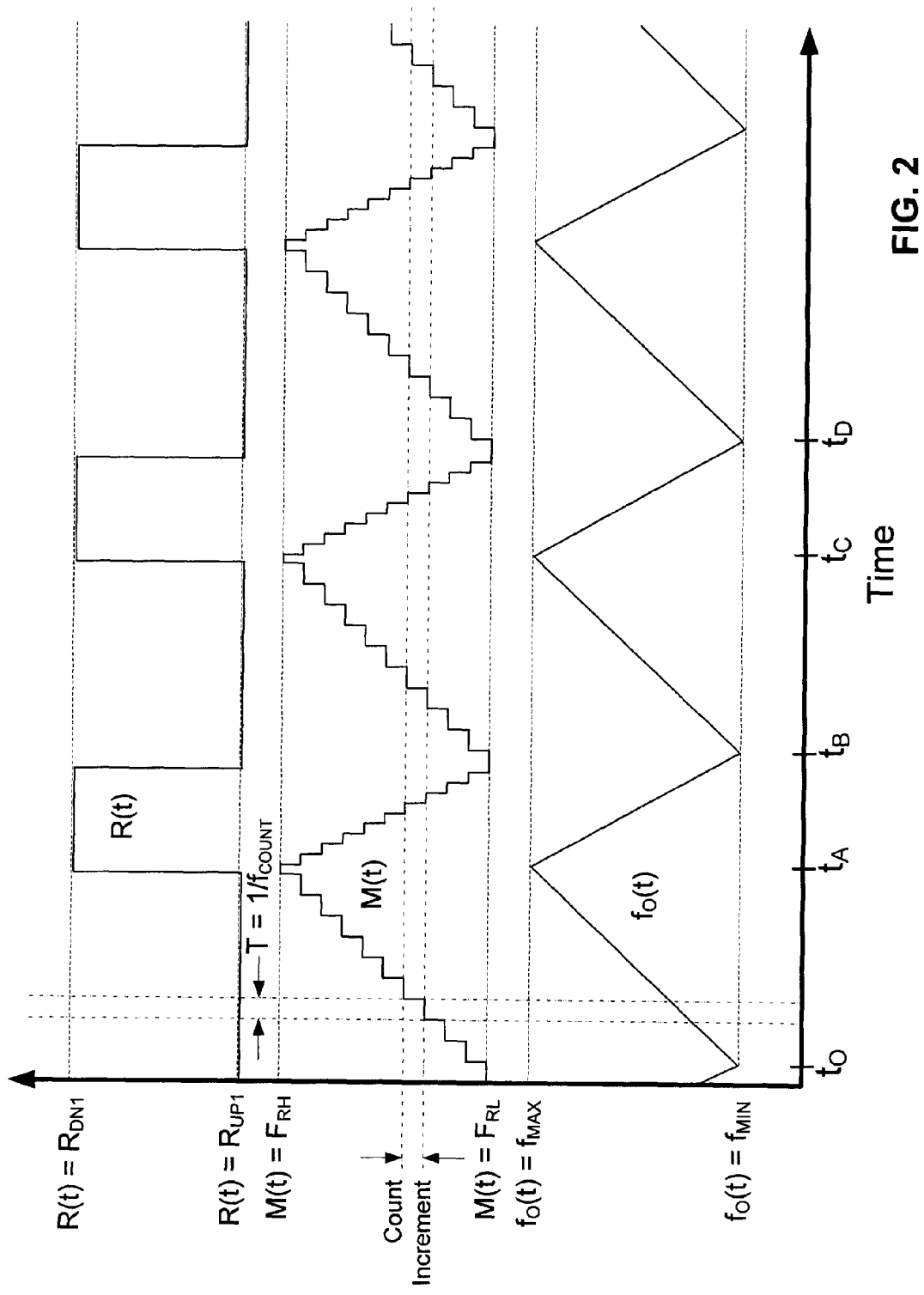
FIG. 2 illustrates an exemplary timing diagram of a frequency ramp control word R(t), a frequency control word M(t), and an output frequency $f_o(t)$ of the fractional-N synthesized chirp generator shown in FIG. 1 according to one aspect of the subject technology.
Figure 4:
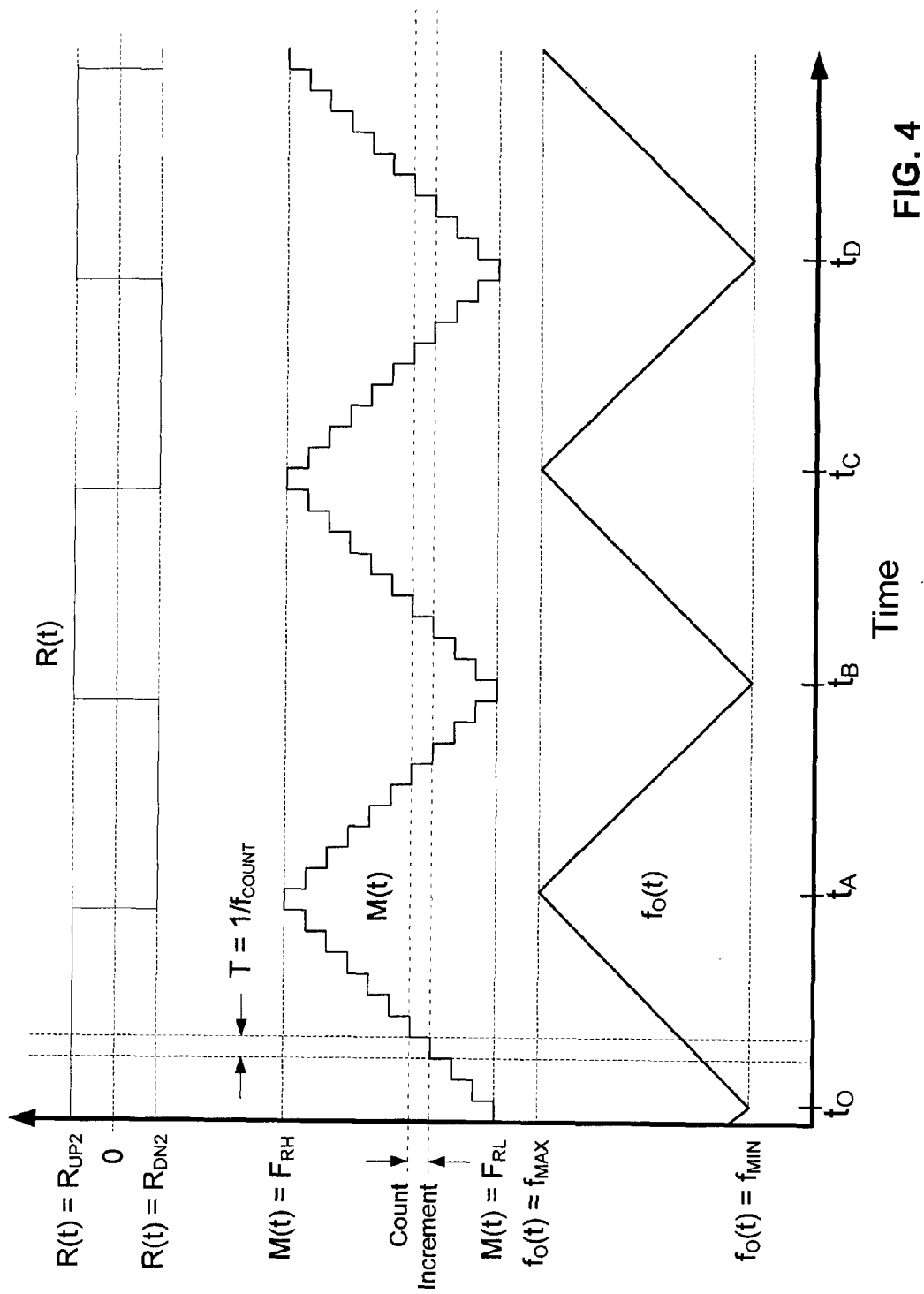
FIG. 4 illustrates an exemplary timing diagram of a frequency ramp control word R(t), a frequency control word M(t), and an output frequency $f_o(t)$ of the fractional-N synthesized chirp generator shown in FIG. 3 according to one aspect of the subject technology, where the up-chirp rate is equal to the down-chirp rate.
Figure 5:
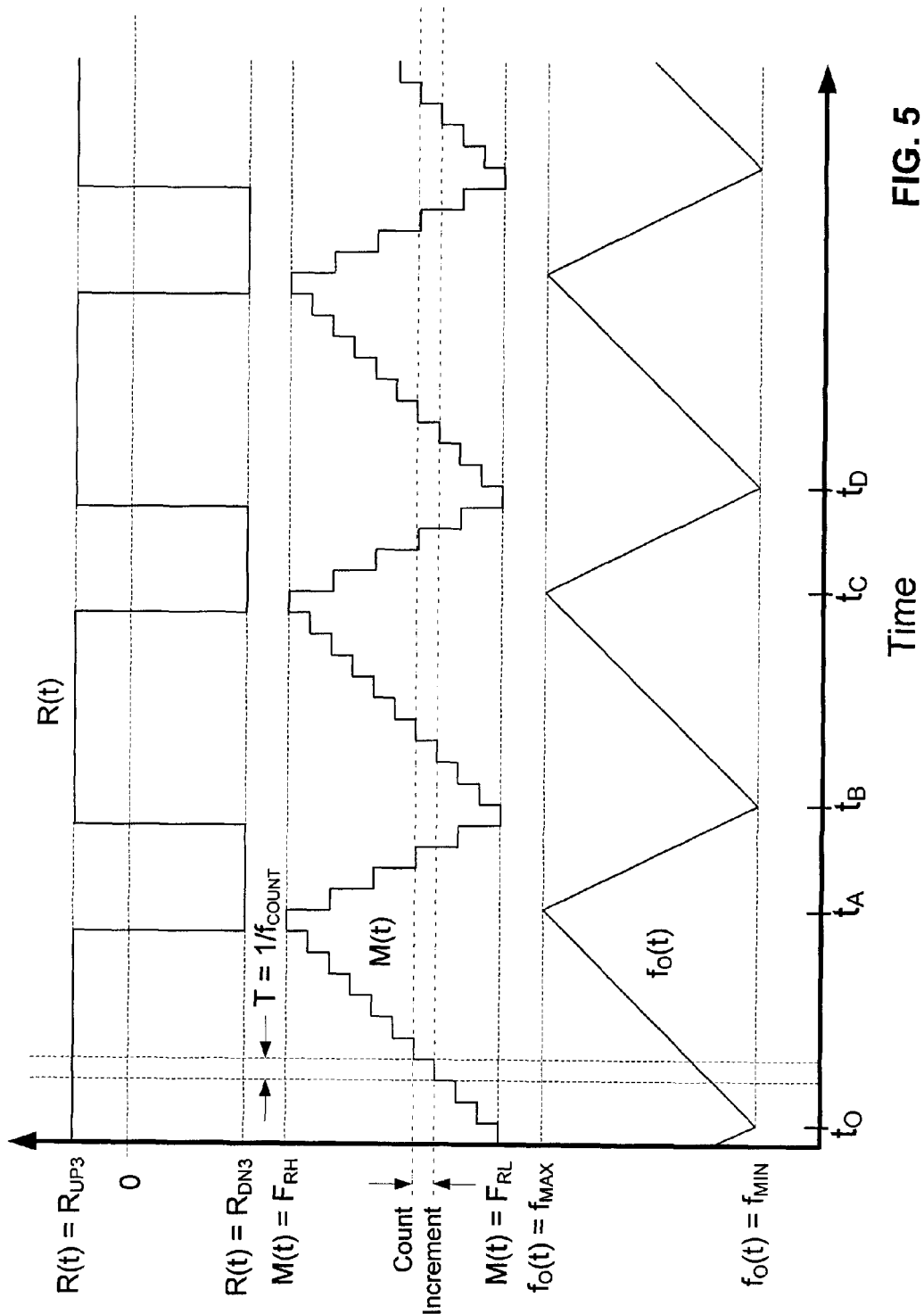
FIG. 5 illustrates another exemplary timing diagram of a frequency ramp control word R(t), a frequency control word M(t), and an output frequency $f_o(t)$ of the fractional-N synthesized chirp generator shown in FIG. 3 according to one aspect of the subject technology, where the up-chirp rate is not equal to the down-chirp rate.

Phrases such as up-chirp and down-chirp are sometimes referred to as ramp-up and ramp-down, or count-up and count-down; and phrases such as up-chirp and down-chirp modes or periods are sometimes referred to as ramp-up and ramp-down modes or periods, or count-up and count-down modes or periods. An up-chirp mode or period (or a ramp-up or count-up mode or period) may be represented, for example, as a mode or period between $t_O$ and $t_A$ and between $t_B$ and $t_C$, as shown in FIGS. 2, 4 and 5. A down-chirp mode or period may be represented, for example, as a mode or period between $t_A$ and $t_B$ and between $t_C$ and $t_D$, as shown in FIGS. 2, 4 and 5. As shown in these figures, an up-chirp mode and a down-chirp mode repeats.

FIG. 2 illustrates an exemplary timing diagram of a frequency ramp control word R(t), a frequency control value M(t), and an output frequency $f_o(t)$ according to one aspect of the subject technology. Referring to FIGS. 1 and 2, the up/down counter 8a is configured to change the frequency control word M(t) at a rate determined by a time interval T (which is determined $f_{COUNT}(t)$). At each time interval T, the frequency control word M(t) may ramp up by a count increment amount during a ramp-up period (e.g., a time period between $t_O$ and $t_A$, and a time period between $t_B$ and $t_C$). At each time interval T, the frequency control word M(t) may ramp down by the count increment amount during a ramp-down period (e.g., a time period between $t_A$ and $t_B$, and a time period between $t_C$ and $t_D$). A counter increment amount may be, for example, an integer (e.g., 1).

In this example, the count increment amount remains constant for a given operating mode. In other words, a count increment amount, by which the up/down counter 8a's output M(t) varies for each clocking time interval T (defined by $f_{COUNT}(t)$) is constant for a given operating mode. By the frequency ramp control word R(t), the clocking rate $f_{COUNT}(t)$ may be varied between two values, and the rate of change of the frequency control word M(t) produced by the up/down counter 8a may be altered, and with it, the rate at which the frequency control word M(t) is ramped up or down.

Still referring to FIGS. 1 and 2, by having an upper frequency limit block 13, a lower frequency limit block 14, a selector 15, and a compare logic block 16 in a ramp controller block 124, the upper frequency limit value $F_{RH}$ and the lower frequency limit value $F_{RL}$ may be selected, and the fractional-N synthesized chirp generator 100 can be set to freerun (e.g., operate automatically without a user interruption). This can produce a continuous sequence of repeating up and down ramp periods as defined by the counter control value C(t) generated by the compare logic block 16. In this example, the selector 15 is configured to select the upper frequency limit value $F_{RH}$ or the lower frequency limit value $F_{RL}$ based on a counter control value C(t), and the selector is configured to produce a frequency limit value $F_R$. The compare logic 16 may compare the frequency control word M(t) to the frequency limit value $F_R$. The upper frequency limit value $F_{RH}$ and the lower frequency limit value $F_{RL}$ may be loaded into the upper frequency limit block 13 and the lower frequency limit block 14, respectively. The blocks 13 and 14 may be digital registers.

When the counter control value C(t) is logic-high (1), i.e., in a count-up mode (or an up-chirp mode), if a frequency control word M(t) is less than the upper frequency limit value $F_{RH}$, then the next counter control value C(t+1) will remain in logic-high (1), i.e., in a count-up mode (or an up-chirp mode). When the counter control value C(t) is logic-high (1), i.e., a count-up mode (or an up-chirp mode), if a frequency control word M(t) is greater than the upper frequency limit value $F_{RH}$, then the next counter control value C(t+1) will go to logic-low (0), i.e., a count-down mode (or a down-chirp mode).

When the counter control value C(t) is logic-low (0), i.e., in a count-down mode (or a down-chirp mode), if a frequency control word M(t) is less than the lower frequency limit value $F_{RL}$, then the next counter control value C(t+1) will go to logic-high (1), i.e., a count-up mode (or an up-chirp mode). While the counter control value C(t) is logic-low (0), i.e., in a count-down mode (or a down-chirp mode), if a frequency control word M(t) is greater than the lower frequency limit value $F_{RL}$, then the next counter control value C(t+1) will remain in logic-low (0), i.e., in a count-down mode (or a down-chirp mode).

FIG. 2 illustrates how a frequency ramp control word R(t) may vary with time. Referring to FIGS. 1 and 2, during an up-chirp period between $t_O$ and $t_A$, the selector 12 may select a ramp-up rate $R_{UP1}$ from the up-chirp ramp rate block 10, and during a down-chirp period between $t_A$ and $t_B$, the selector 12 may select a ramp-down rate $R_{DN1}$ from the down-chirp ramp rate block 11. Thus, in this example, the frequency ramp control word R(t) is $R_{UP1}$ during an up-chirp period between $t_O$ and $t_A$, and the frequency ramp control word R(t) is $R_{DN1}$ during a down-chirp period between $t_A$ and $t_B$.

FIG. 2 also illustrates how a frequency control value M(t) may vary with time. Again referring to FIGS. 1 and 2, a clocking rate $f_{COUNT}(t)$ (i.e., the frequency of a clock signal supplied to the up/down counter 8a) is determined by the frequency ramp control word R(t) and the input frequency $f_{REF}(t)$. A one-to-one correspondence may exist between (i) the frequency ramp control word R(t) (or the values contained in the up-chirp ramp rate block 10 and the down-chirp ramp rate block 11) and (ii) the clocking rate $f_{COUNT}(t)$. A time interval T is $1/f_{COUNT}(t)$. An up/down counter 8a is configured to change the frequency control word M(t) at a rate determined by the clocking rate $f_{COUNT}(t)$, and the up/down counter 8a outputs a frequency control word M(t) at each time interval T. M(t) may be ramped up at each time interval T during an up-chirp period, and M(t) may be ramped down at each time interval T during a down-chirp period.

In this example, a time interval T for an up-chirp period between $t_O$ and $t_A$ is a constant value, and a time interval T for a down-chirp period between $t_A$ and $t_B$ is another constant value. In this example, a time interval T for an up-chirp period between $t_O$ and $t_A$ is longer than a time interval T for a down-chirp period between $t_A$ and $t_B$ because R(t) for the up-chirp period between $t_O$ and $t_A$ (which is $R_{UP1}$) is smaller than R(t) for the down-chirp period between $t_A$ and $t_B$ (which is $R_{DN1}$).

The up/down counter 8a is also configured to change the magnitude of the frequency control word M(t) by a count increment amount at each time interval T, and in this example, the count increment amount is constant for a given mode of operation, as described earlier.

As shown in FIG. 2, the frequency control word M(t) increases in linear steps with time at a first constant rate determined by $f_{COUNT}(t)$ during an up-chirp period (e.g., between $t_O$ and $t_A$), and the frequency control word M(t) decreases in linear steps with time at a second constant rate determined by $f_{COUNT}(t)$ during a down-chirp period (e.g., between $t_A$ and $t_B$). The up-chirp period and the down-chirp period are consecutive, and $f_{COUNT}(t)$ is at a first constant value during an up-chirp period, and $f_{COUNT}(t)$ is at a second constant value during a down-chirp period. Accordingly, a time interval T remains constant during an up-chirp period, and a time interval T remains constant during a down-chirp period. The frequency $f_{COUNT}(t)$ for an up-chirp period may be the same or different from $f_{COUNT}(t)$ for a down-chirp period; a time interval T for an up-chirp period may be the same or different from a time interval T for a down-chirp period.

FIG. 2 further illustrates how the output frequency $f_o(t)$ of a chirped RF output signal may vary with time. A one-to-one correspondence exists between the frequency control word M(t) and the output frequency $f_o(t)$ of a chirped RF output signal. For a given $f_{REF}(t)$, M(t) may define $f_o(t)$. For example, during an up-chirp period (e.g., between $t_O$ and $t_A$), the frequency control word M(t) may ramp up in linear steps from a lower frequency limit value $F_{RL}$ to an upper frequency limit value $F_{RH}$. In response to the change in M(t), the output frequency $f_o(t)$ may ramp up linearly from a minimum output frequency value $F_{MIN}$ to a maximum output frequency value $F_{MAX}$. During a down-chirp period (e.g., between $t_A$ and $t_B$), the frequency control word M(t) may ramp down in linear steps from the upper frequency limit value $F_{RH}$ to the lower frequency limit value $F_{RL}$. In response to the change in M(t), the output frequency $f_o(t)$ may ramp down linearly from the maximum output frequency value $F_{MAX}$ to the minimum output frequency value $F_{MIN}$.

In this example, $R_{DN1}=2*R_{UP1}$. Thus, $f_{COUNT}(t)$ for a down-chirp period is twice the $f_{COUNT}(t)$ for an up-chirp period, and the time interval T for an up-chirp period is twice the time interval T for a down-chirp period. M(t) for a down-chirp period changes twice as fast as M(t) for an up-chirp period, and in response to the change in M(t), $f_o(t)$ for a down-chirp period also changes twice as fast as $f_o(t)$ for an up-chirp period.

In operation, a fractional-N synthesized chirp generator 100 may have many operating modes (e.g., mode 1, mode 2, mode 3, through mode P). For each operating mode, a fractional-N synthesized chirp generator 100 may have many cycles of an up-chirp period and a down-chirp period. In other words, the up-chirp period and the down-chirp period may be repeated many times (e.g., a few hundred times). FIG. 2 merely shows a portion of the cycles (e.g., a little more than three cycles) in an operating mode. Each operating mode may have different values for parameters such as $R_{UP}$, $R_{DN1}$, $f_{COUNT}(t)$, T, $F_{RH}$, $F_{RL}$, $F_{MIN}$, and $F_{MAX}$. These values may be predetermined.

For one mode, $R_{DN}$ may be equal to $R_{UP}$, in which case, $f_{COUNT}(t)$ for an up-chirp period is equal to $f_{COUNT}(t)$ for a down-chirp period. The time interval T for an up-chirp period is equal to the time interval T for a down-chirp period. M(t) changes at the same rate for an up-chirp period and a down-chirp period, and $f_o(t)$ also changes at the same rate for an up-chirp period and a down-chirp period.

For another mode, $R_{DN}$ may be different from $R_{UP}$, in which case, $f_{COUNT}(t)$ for an up-chirp period is different from $f_{COUNT}(t)$ for a down-chirp period. The time interval T for an up-chirp period is also different from the time interval T for a down-chirp period. M(t) changes at one rate for an up-chirp period and at a different rate for a down-chirp period, and $f_o(t)$ changes at one rate for an up-chirp period and at a different rate for a down-chirp period.

Figure 3:
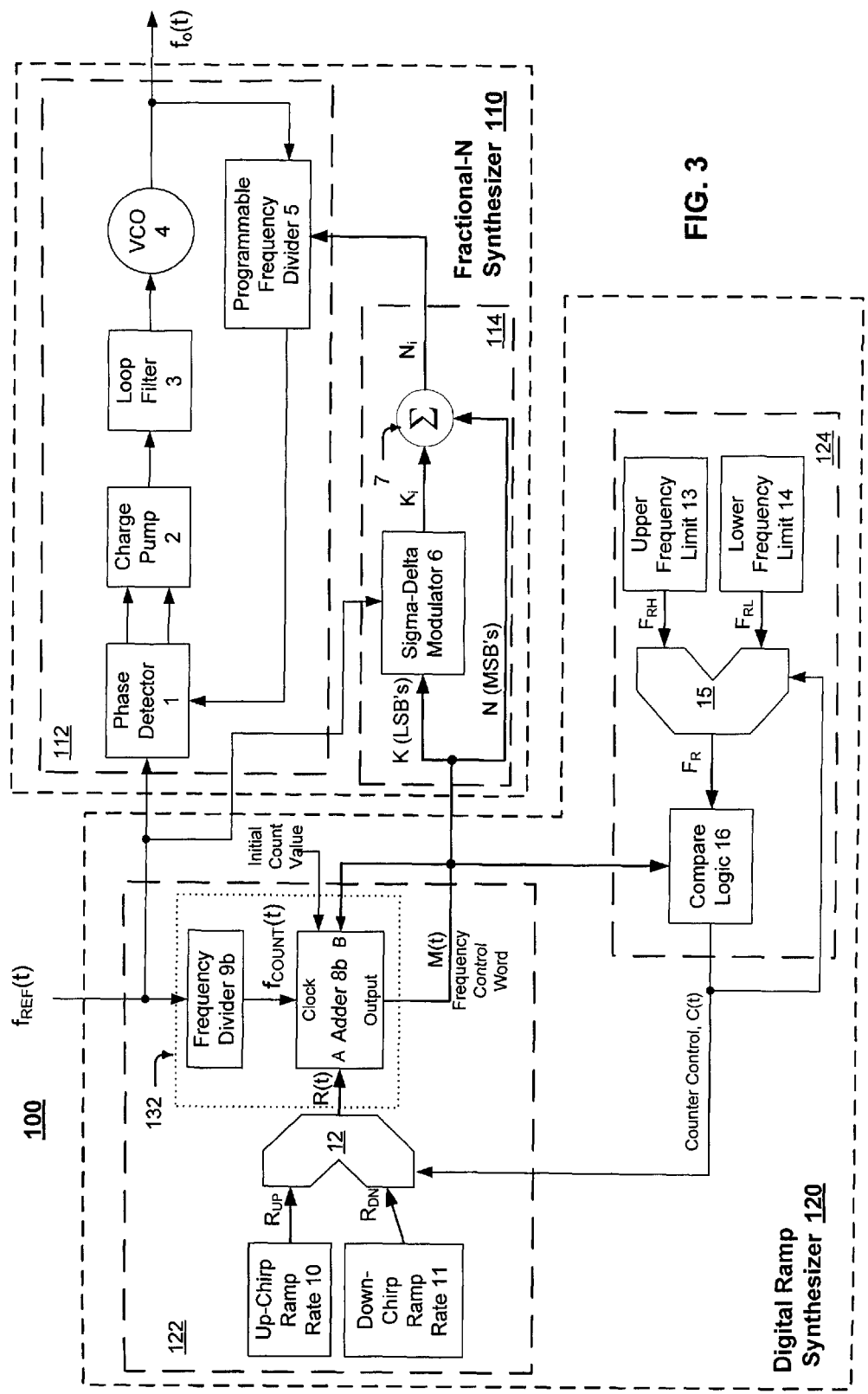
FIG. 3 is a diagram illustrating another example of a fractional-N synthesized chirp generator according to one aspect of the subject technology.

FIG. 3 is a diagram illustrating another example of a fractional-N synthesized chirp generator according to one aspect of the subject technology. A fractional-N synthesized chirp 100 shown in FIG. 3 is the same as the fractional-N synthesized chirp 100 shown in FIG. 1, except for a frequency control value generation block 132 in which a frequency divider 9b is used instead of the programmable frequency divider 9a of FIG. 1, and an adder 8b is used instead of an up/down counter 8a of FIG. 1. In FIG. 3, the frequency divider 9b is configured to receive $f_{REF}(t)$ and is configured to produce $f_{COUNT}(t)$ based on $f_{REF}(t)$. The adder 8b is configured to receive R(t) from a selector 12, $f_{COUNT}(t)$ from the frequency divider 9b, an initial count value, and a frequency control word M(t). In response to its input, the adder 8b is configured to produce a frequency control word M(t).

In this example, the frequency control word M(t) and the output frequency $f_o(t)$ vary utilizing a clocking rate $f_{COUNT}(t)$ that is constant for a given operating mode. The clocking rate $f_{COUNT}(t)$ is derived by the fixed frequency divider 9b. In this exemplary implementation, the adder 8b adds R(t), which may be a selectable integer value, to the present value of the output from the adder 8b (i.e., the present value of a frequency control word M(t)). By selecting a different value for R(t), depending upon the direction and rate of ramp desired, the frequency ramp rate will also be varied. The selection of which value ($R_{UP}$ or $R_{DN}$) is desired is derived by the same compare logic 16 as was used in the previous configuration shown in FIG. 1. It should be noted that values $R_{UP}$ and $R_{DN}$ for the exemplary configuration shown in FIG. 3 may have signed words, while values $R_{UP}$ and $R_{DN}$ for the exemplary configuration shown in FIG. 1 may have unsigned words according to one aspect. For the exemplary configuration shown in FIG. 3, $R_{DN}$ may have a negative sign bit, and $R_{UP}$ may have a positive sign bit.

FIGS. 4 and 5 illustrate exemplary timing diagrams of a frequency ramp control word R(t), a frequency control word M(t), and an output frequency $f_o(t)$ for the fractional-N synthesized chirp generator shown in FIG. 3 according to one aspect of the subject technology. FIG. 4 illustrates waveforms where the magnitude of a ramp-up rate $R_{UP}$ (sometimes referred to as an up-chirp rate) is equal to the magnitude of a ramp-down rate $R_{DN}$ (sometimes referred to as a down-chirp rate), except that $R_{UP}$ is positive, and $R_{DN}$ is negative (i.e., $R_{DN2} = -R_{UP2}$). FIG. 5 illustrates waveforms where the magnitude of a ramp-down rate $R_{DN}$ (or a down-chirp rate) is different from the magnitude of a ramp-up rate $R_{UP}$ (or an up-chirp rate), where $R_{DN}$ is negative, and $R_{UP}$ is positive. In this example, the magnitude of a ramp-down rate $R_{DN}$ is twice the magnitude of a ramp-up rate $R_{UP}$ (i.e., $R_{DN3} = -2*R_{UP3}$).

The output frequency $f_o(t)$ versus time waveforms are shown, where the increasing and decreasing frequency ramp rates are shown for the case where the ramp-up and ramp-down rates are equal (FIG. 4) and unequal (FIG. 5). A maximum output frequency value $F_{MAX}$ is associated with an upper frequency limit value $F_{RH}$; a minimum output frequency value $F_{MIN}$ is associated with a lower frequency limit value $F_{RL}$. When the frequency control word M(t) from the adder 8b of FIG. 3 crosses the selected threshold $F_{RH}$, at time $t_A$, a ramp rate R(t) is switched by a selector 12 based on a counter control value C(t). The selector 12 selects $R_{DN}$ from a down-chirp ramp rate block 11. In response to the change in the ramp rate R(t), the adder 8b is also switched to a down-chirp mode. C(t), now at logic low (0), also controls a selector 15, which then selects $F_{RL}$ from a lower frequency limit block 14. The frequency control word M(t) is ramped down until M(t) is less than $F_{RL}$. This occurs at time $t_B$. At this time a compare logic 16 sets C(t) to logic-high, and both selectors 12 and 15 are switched back to select $R_{UP}$ and $F_{RH}$, respectively. This pattern may repeat.

Similar to FIG. 2, in FIG. 3, C(t) is in a count-up mode (or an up-chirp mode) if C(t) is logic-high (1), and C(t) is in a count-down mode (or a down-chirp mode) if C(t) is logic-low (0). According to one aspect, $R_{DN}$ is a negative number, and is selected for a count-down mode (or a down-chirp mode), and $R_{UP}$ is a positive number, and is selected for a count-up mode (or an up-chirp mode).

One of the differences between FIG. 2 (a timing diagram for the configuration shown in FIG. 1) and FIGS. 4 and 5 (timing diagrams for the configuration shown in FIG. 3) is that in FIG. 2, the time interval T may vary but the count increment amount remains constant for a given operating mode while in FIGS. 4 and 5, the time interval T remains constant but the count increment amount may vary for a given operating mode, according to one aspect of the subject technology. In other words, in FIG. 2 (or for the configuration shown in FIG. 1), the rate at which M(t) changes its value may vary with time while the amount of change in magnitude of M(t) for each time interval T remains constant for a given operating mode, and in FIGS. 3 and 4 (or for the configuration shown in FIG. 3), the rate at which M(t) changes its value stays constant with time while the amount of change in magnitude of M(t) for each time interval T may vary for a given operating mode.

Figure 6:
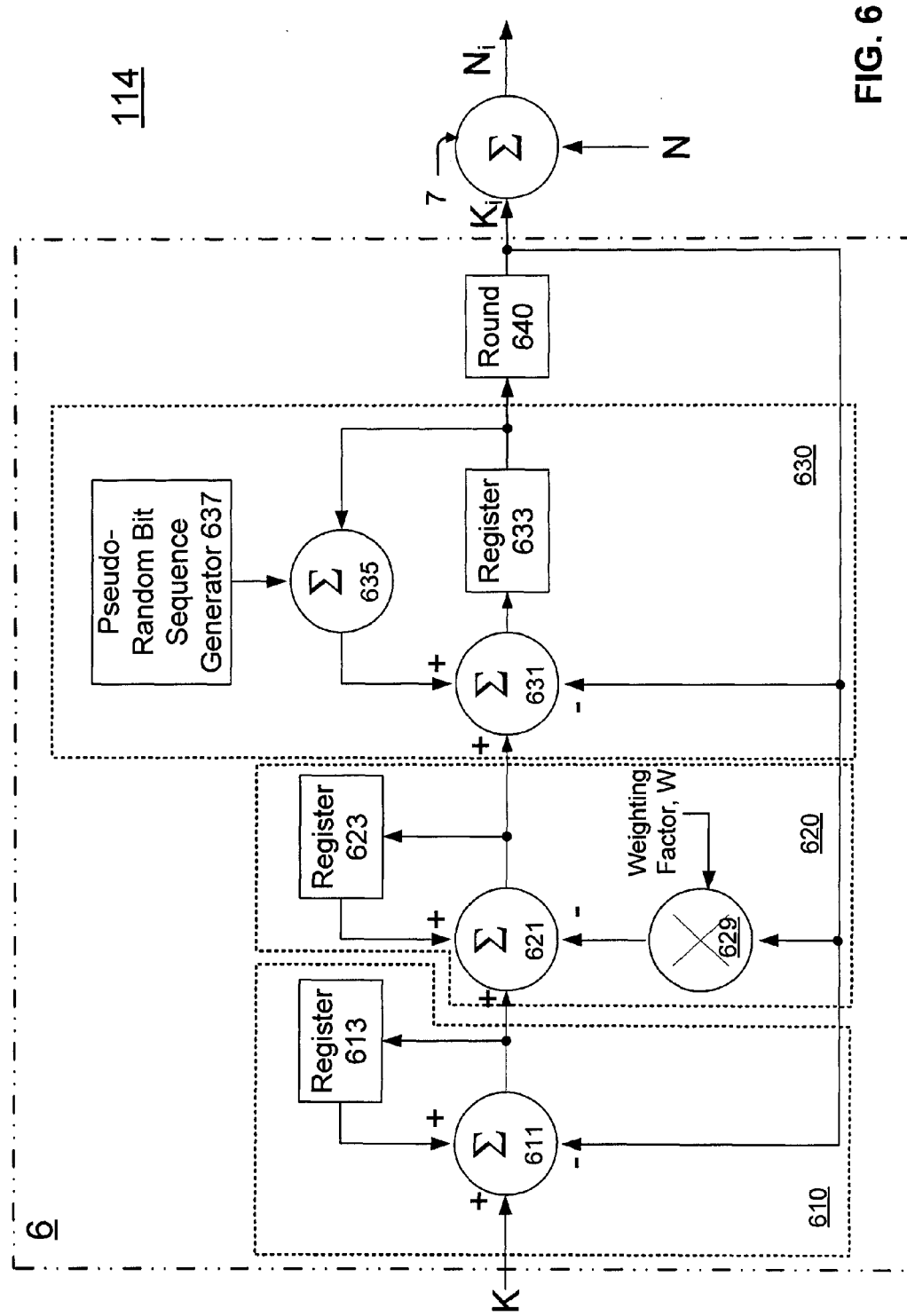
FIG. 6 is a diagram illustrating an example of a sigma-delta modulator module according to one aspect of the subject technology.

FIG. 6 is a diagram illustrating an example of a sigma-delta modulator module according to one aspect of the subject technology. A sigma-delta modulator module 114 may include a sigma-delta modulator 6 and a summation block 7. The sigma-delta modulator 6 may include a first integrator stage 610, a second integrator stage 620, a third integrator stage 630, and a rounding block 640.

The first integrator stage 610 may include a summation block 611 and a register block 613. The first integrator stage 610 may receive the lower significant bits K of the frequency control word M(t) as an input. The first integrator stage 610 may be configured (i) to add one or more lower significant bits K of the frequency control word M(t) to a value from the register block 613 and (ii) to subtract a sequence of count values $K_i$ outputted by the sigma-delta modulator 6 from the result of (i). The register block 613 may store the output of the first integrator stage 610.

The second integrator stage 620 may include a summation block 621, a register block 623, and a multiplier 629. The second integrator stage 620 may be configured (i) to add an output of the first integrator stage 610 to a value from the register block 623 and (ii) to subtract a sequence of count values $K_i$ multiplied by a weighting factor W, from the result of (i). The register block 623 may store the output of the second integrator stage 620.

The third integrator stage 630 may include a summation block 631, a summation block 635, a register block 633, and a pseudo-random bit sequence generator 637. The pseudo-random bit sequence generator 637 can improve the spurious performance of the fractional-N synthesizer 110. The output of the summation block 631 may be stored in the register block 633. The summation block 635 may add a value from the pseudo-random bit sequence generator 637 to a value from the register block 633. The summation block 631 may be configured (i) to add the output of the second integrator stage 620 to the output of the summation block 635 and (ii) to subtract a sequence of count values $K_i$ outputted by the sigma-delta modulator 6 from the result of (i). The output of the third integrator stage 630 may be provided to the rounding block 640.

The rounding block 640 may be configured to generate integer values. The output of the rounding block 640 may be coupled to the summation block 611 of the first integrator stage 610, to the multiplier 629, and to the summation block 631.

The summation block 7 may be configured to add the integer values from the rounding block 640 to one or more most significant values N of the frequency control word M(t) and may be configured to produce the ultimate frequency control word sequence denoted as $N_i$.

In operation, the first integrator stage 610 may receive one or more lower significant bits K of the frequency control word M(t). The first integrator stage 610 may produce a difference value (or an error term) between K and the output of the sigma-delta modulator 6 ($K_i$). The second integrator stage 620 may integrate error terms with a weighting factor W. The third integrator stage 630 may integrate error terms with a pseudo-random bit sequence, perform steep noise shaping, and produce a sequence of bits or a sequence of count values (non-integer values). The rounding block 640 rounds up the sequence of count values from the third integrator stage 630 to produce integer values.

For example, if M(t) includes 32 bits, K may include 12 bits, and N may include 20 bits. The rounding block 640 may round up the output of the third integrator stage 630 and produce, for example, 3 bits as $K_i$ (e.g., values between −4 and +4) that are integer values. However, these integer values on the average over a certain time window represent a non-integer value. In other words, these integer values $K_i$ represent a fractional count value when averaged over a time window $T_L$ determined by a phaselock loop bandwidth of a frequency synthesizer (e.g., 112). The relationship between $T_L$ and a phaselock loop bandwidth of a frequency synthesizer (e.g., 112) may be expressed as follows: $T_L=1/$(a phaselock loop bandwidth of a frequency synthesizer).

For each time interval T, a sigma-delta modulator 6 may produce a plurality of values $K_i$, and a sigma-delta modulator module 114 may produce a plurality of values $N_i$ because (i) a sigma-delta modulator 6 (or a sigma-delta modulator module 114) receives and operates utilizing $f_{REF}(t)$ which is greater than $f_{COUNT}(t)$, and (ii) M(t) is produced by an up/down counter 8a or an adder 8b, which receives and operates utilizing $f_{COUNT}(t)$.

Figure 7:
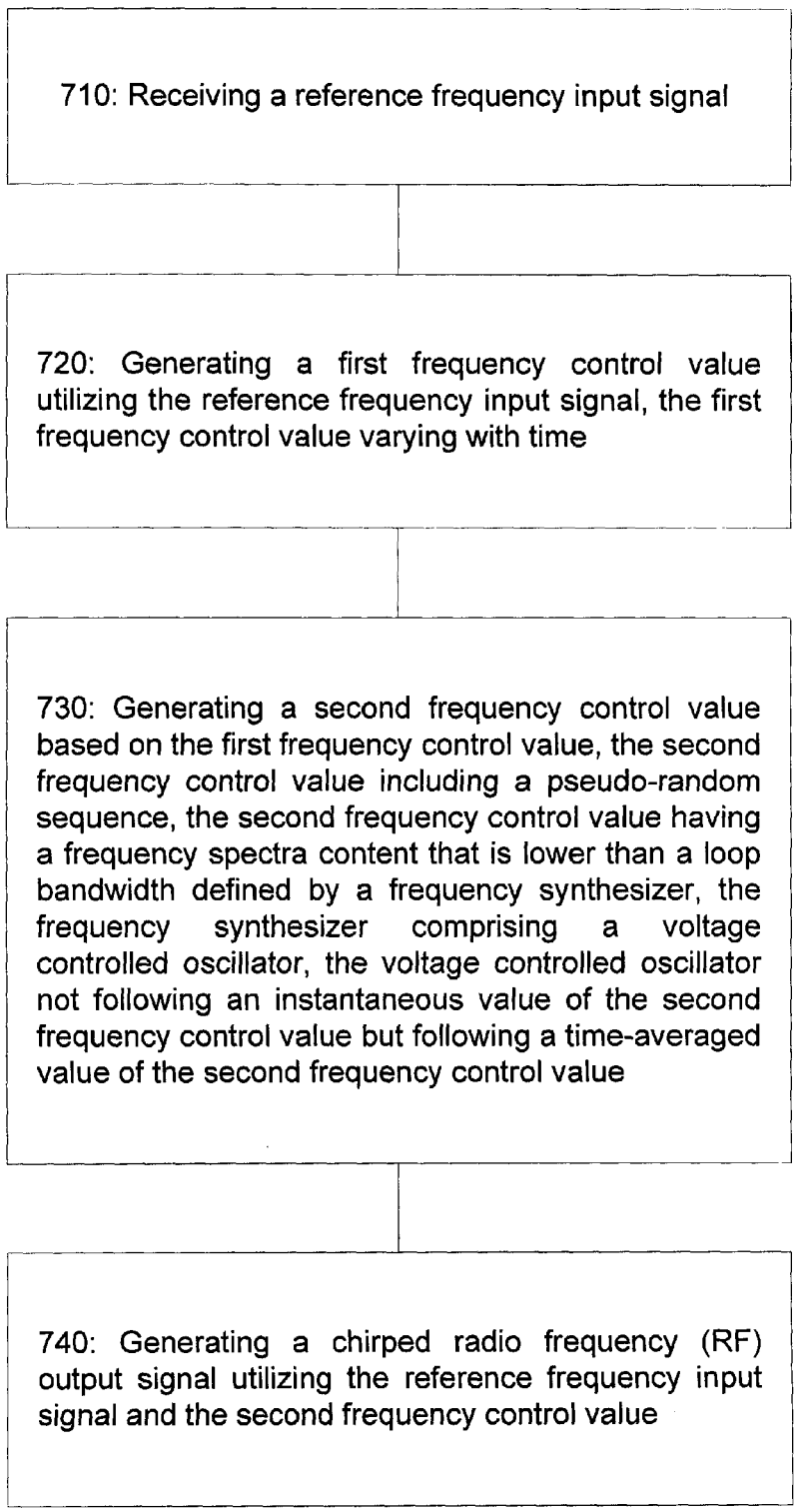
FIG. 7 is a flow chart illustrating an exemplary operation of a fractional-N synthesized chirp generator according to one aspect of the subject technology.

Various aspects of the subject technology are described below. FIG. 7 is a flow chart illustrating an exemplary operation of a fractional-N synthesized chirp generator according to one aspect of the subject technology. A method is provided for generating a chirped radio frequency (RF) output signal. The method comprises receiving a reference frequency input signal (710), and generating a first frequency control value utilizing the reference frequency input signal (720). The first frequency control value varies with time.

The method further comprises generating a second frequency control value based on the first frequency control value (730). The second frequency control value includes a pseudo-random sequence. The second frequency control value has a frequency spectra content that is higher than a loop bandwidth defined by a frequency synthesizer. The frequency synthesizer comprises a voltage controlled oscillator. The voltage controlled oscillator does not follow an instantaneous value of the second frequency control value but rather follows a time-averaged value of the second frequency control value. The method further comprises generating a chirped radio frequency (RF) output signal utilizing the reference frequency input signal and the second frequency control value (740).

According to another aspect of the subject technology, a response rate of the voltage controlled oscillator is slower than a rate of change of the instantaneous value of the second frequency control value.

According to another aspect of the subject technology, the method further comprises selecting an upper frequency limit value or a lower frequency limit value based on a counter control value, producing a frequency limit value, and comparing the first frequency control value to the frequency limit value to produce a counter control value.

According to another aspect of the subject technology, the method further comprises selecting an up-chirp ramp rate or a down-chirp ramp rate based on a counter control value, producing a frequency ramp control value, and generating a counter clock frequency signal based on the reference frequency input signal and the frequency ramp control value. The first frequency control value is generated based on a counter control value and the counter clock frequency signal.

According to another aspect of the subject technology, the method further comprises selecting an up-chirp ramp rate or a down-chirp ramp rate based on a counter control value, producing a ramp control value, and generating an adder clock frequency signal based on the reference frequency input signal. The first frequency control value is generated based on the ramp control value and the adder clock frequency signal.

According to one aspect of the subject technology, a fractional-N synthesized chirp generator comprises a fractional-N synthesizer and a digital ramp synthesizer. The fractional-N synthesizer comprises a frequency synthesizer and a sigma-delta modulator module. The fractional-N synthesizer is configured to receive a reference frequency input signal and a frequency control value. The fractional-N synthesizer is configured to transform the reference frequency signal and the frequency control value to a chirped radio frequency (RF) output signal in a deterministic manner.

The digital ramp synthesizer is configured to receive the reference frequency input signal and configured to generate the frequency control value utilizing the reference frequency input signal. The digital ramp synthesizer is further configured to provide the frequency control value to the fractional-N synthesizer. The frequency control value varies with time.

According to another aspect of the subject technology, the frequency synthesizer comprises a phase detector, a charge pump coupled to the phase detector, a loop filter coupled to the charge pump, a voltage controlled oscillator coupled to the loop filter, and a frequency divider coupled to the phase detector and the voltage controlled oscillator. The fractional-N synthesizer is configured to generate the chirped RF output signal independent of a tuning curve of the voltage controlled oscillator.

According to another aspect of the subject technology, the sigma-delta modulator module comprises a sigma-delta modulator configured to receive one or more lower significant values of the frequency control value and the reference frequency input signal. The sigma-delta modulator is configured to transform the one or more lower significant values of the frequency control value to a second frequency control value utilizing a pseudo-random sequence. The second frequency control value represents a fractional count value when averaged over a time window.

According to another aspect of the subject technology, the sigma-delta modulator module further comprises a summation block configured to add the second frequency control value and one or more most significant values (N) of the frequency control value. The summation block is configured to produce a fractional-N frequency control value having a frequency spectra content that is higher than a loop bandwidth defined by the frequency synthesizer.

According to another aspect of the subject technology, the sigma-delta modulator module comprises a first integrator stage, a second integrator stage, a third integrator stage, a rounding block, and a summation block. The first integrator stage comprises a summation block and a register block. The first integrator stage is configured to receive one or more lower significant values of the frequency control value. The second integrator stage comprises a summation block, a register block, and a multiplier.

The third integrator stage comprises one or more summation blocks, a register block, and a pseudo-random bit sequence generator. The rounding block is configured to generate integer values. An output of the rounding block is coupled to the summation block of the first integrator stage, to the multiplier, and to one of the one or more summation blocks. A summation block is configured to receive the integer values and one or more most significant values (N) of the frequency control value and is configured to produce a second frequency control value.

According to another aspect of the subject technology, the digital ramp synthesizer comprises a ramp synthesizer block and a ramp controller block.

According to another aspect of the subject technology, the ramp synthesizer block comprises an up-chirp ramp rate block configured to provide an up-chirp ramp rate and a down-chirp ramp rate block configured to provide a down-chirp ramp rate. The ramp synthesizer block further comprises a selector configured to select the up-chirp ramp rate or the down-chirp ramp rate based on a counter control value. The selector is configured to produce a frequency ramp control value.

The ramp synthesizer block further comprises a frequency divider configured to receive the reference frequency input signal and the frequency ramp control value and is configured to produce a counter clock frequency signal based on the reference frequency input signal and the frequency ramp control value. The ramp synthesizer block further comprises an up/down counter configured to receive the counter control value, the counter clock frequency signal and an initial count value. The up/down counter is configured to produce the frequency control value.

According to another aspect of the subject technology, the up/down counter is configured to change the frequency control value at a rate determined by a frequency of the counter clock frequency signal and configured to change the frequency control value by a count increment amount at each time interval. The count increment amount is constant for a given mode of operation. The frequency control value increases in linear steps with time at a first rate determined by the frequency of the counter clock frequency signal during a first time period. The frequency control value decreases in linear steps with time at a second rate determined by the frequency of the counter clock frequency signal during a second time period. The first and second time periods are consecutive. The frequency of the counter clock frequency signal is at a constant value during the first time period, and the frequency of the counter clock frequency signal is at a constant value during the second time period.

According to another aspect of the subject technology, the ramp controller block comprises an upper frequency limit block configured to provide an upper frequency limit value, a lower frequency limit block configured to provide a lower frequency limit value, a selector configured to select the upper frequency limit value or the lower frequency limit value based on a counter control value. The selector is configured to produce a frequency limit value. The ramp controller block further comprises a compare logic block configured to receive the frequency limit value and the frequency control value. The compare logic block is configured to produce the counter control value.

According to another aspect of the subject technology, the ramp synthesizer block comprises an up-chirp ramp rate block configured to provide an up-chirp ramp rate, a down-chirp ramp rate block configured to provide a down-chirp ramp rate, a selector configured to select the up-chirp ramp rate or the down-chirp ramp rate based on a counter control value. The selector is configured to produce a ramp control value. The ramp synthesizer block further comprises a frequency divider configured to receive the reference frequency input signal and is configured to produce an adder clock frequency signal. The ramp synthesizer block further comprises an adder configured to receive the ramp control value, the adder clock frequency signal, and an initial count value. The adder is configured to produce the frequency control value.

According to another aspect of the subject technology, the adder is configured to change the frequency control value at each time interval determined by the adder clock frequency signal, and the adder is configured to change the frequency control value by an increment amount determined by the ramp control value.

According to another aspect of the subject technology, the fractional-N synthesizer is configured to generate a second frequency control value utilizing a pseudo-random sequence and at least a portion of the frequency control value. The second frequency control value has a frequency spectra content that is higher than a loop bandwidth defined by the frequency synthesizer.

According to another aspect of the subject technology, the frequency synthesizer comprises a voltage controlled oscillator configured to follow a time-averaged value of the second frequency control value and configured not to follow an instantaneous value of the second frequency control value. The frequency synthesizer further comprises and a frequency divider coupled to the voltage controlled oscillator. The frequency divider is configured to oscillate between multiple values of the second frequency control value. A response rate of the voltage controlled oscillator is slower than a rate of change of the instantaneous value of the second frequency control value.

According to another aspect of the subject technology, a one-to-one correspondence exists between the frequency control value and the frequency of the chirped RF output signal.

According to another aspect of the subject technology, the chirped RF output signal varies linearly with time. The chirped RF output signal increases linearly with time at a first rate during a first time period. The chirped RF output signal decreases linearly with time at a second rate during a second time period. The first and second time periods are consecutive.

According to another aspect of the subject technology, the first rate is equal to the second rate. According to another aspect of the subject technology, a transmitter integrated circuit comprises the fractional-N synthesized chirp generator.

Those of skill in the art would appreciate that various components and blocks may be arranged differently (e.g., arranged in a different order, or partitioned in a different way) all without departing from the scope of the subject technology. It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. A component is sometimes referred to as a module, a block, or a circuit block interchangeably.

Phrases such as "based on" A, "defined by" A, "determined by" A, "by" A, "producing" A, "utilizing" A, or the like are not intended to mean "based solely on" A, "defined solely by" A, "determined solely by" A, "solely by" A, "producing solely" A, "utilizing solely" A, but rather "based on at least" A, "defined by at least" A, "determined by at least" A, "by at least" A, "producing at least" A, "utilizing at least" A, or the like.

A phrase such as an "aspect" does not imply that such aspect is essential to the subject technology or that such aspect applies to all configurations of the subject technology. A disclosure relating to an aspect may apply to all configurations, or one or more configurations. A phrase such as an "embodiment" does not imply that such embodiment is essential to the subject technology or that such embodiment applies to all configurations of the subject technology. A disclosure relating to an embodiment may apply to all embodiments, or one or more embodiments.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A fractional-N synthesized chirp generator, comprising: a fractional-N synthesizer configured to receive a reference frequency input signal and a first frequency control value, the fractional-N synthesizer configured to transform the reference frequency input signal and the first frequency control value to a chirped radio frequency (RF) output signal in a deterministic manner, the fractional-N synthesizer comprising: a frequency synthesizer comprising: a voltage controlled oscillator; and a programmable frequency divider, the programmable frequency divider configured to receive a second frequency control value; a sigma-delta modulator module comprising: a sigma-delta modulator configured to receive one or more lower significant values of the first frequency control value and the reference frequency input signal, the sigma-delta modulator configured to transform the one or more lower significant values of the frequency control value to a third frequency control value utilizing a pseudo-random sequence, the third frequency control value representing a fractional count value when averaged over a time window; and a summation block configured to add the third frequency control value and one or more most significant values of the first frequency control value, the summation block configured to produce the second frequency control value having a frequency spectra content that is higher than a loop bandwidth defined by the frequency synthesizer; and a digital ramp synthesizer configured to receive the reference frequency input signal, the digital ramp synthesizer configured to generate the first frequency control value utilizing the reference frequency input signal, the digital ramp synthesizer configured to provide the first frequency control value to the fractional-N synthesizer, the first frequency control value varying with time, the digital ramp synthesizer comprising: a ramp synthesizer block comprising: an up-chirp ramp rate block configured to provide an up-chirp ramp rate; a down-chirp ramp rate block configured to provide a down-chirp ramp rate; a selector configured to select the up-chirp ramp rate or the down-chirp ramp rate based on a counter control value, the selector configured to produce a frequency ramp control value; and a frequency control value generation block configured to produce the first frequency control value utilizing the reference frequency input signal and the frequency ramp control value; and a ramp controller block comprising: an upper frequency limit block configured to provide an upper frequency limit value; a lower frequency limit block configured to provide a lower frequency limit value; a second selector configured to select the upper frequency limit value or the lower frequency limit value based on a counter control value, the second selector configured to produce a frequency limit value; and a compare logic block configured to receive the frequency limit value and the first frequency control value, the compare logic block configured to produce a counter control value.

2. A fractional-N synthesized chirp generator, comprising: a fractional-N synthesizer comprising a frequency synthesizer and a sigma-delta modulator module, the fractional-N synthesizer configured to receive a reference frequency input signal and a frequency control value, the fractional-N synthesizer configured to transform the reference frequency input signal and the frequency control value to a chirped radio frequency (RF) output signal in a deterministic manner; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time, wherein the sigma-delta modulator module comprises a sigma-delta modulator configured to receive a first portion of the frequency control value and a summation block configured to add an output of the sigma-delta modulator with a second portion of the frequency control value.

3. The fractional-N synthesized chirp generator of claim 2, wherein the frequency synthesizer comprises:
a phase detector;
a charge pump coupled to the phase detector;
a loop filter coupled to the charge pump;
a voltage controlled oscillator coupled to the loop filter; and
a frequency divider coupled to the phase detector and the voltage controlled oscillator, wherein the fractional-N synthesizer is configured to generate the chirped RF output signal independent of a tuning curve of the voltage controlled oscillator.

4. A fractional-N synthesized chirp generator, comprising: a fractional-N synthesizer comprising a frequency synthesizer and a sigma-delta modulator module, the fractional-N synthesizer configured to receive a reference frequency input signal and a frequency control value, the fractional-N synthesizer configured to transform the reference frequency input signal and the frequency control value to a chirped radio frequency (RF) output signal in a deterministic manner; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time, wherein the sigma-delta modulator module comprises a sigma-delta modulator configured to receive one or more lower significant values of the frequency control value and the reference frequency input signal, the sigma-delta modulator configured to transform the one or more lower significant values of the frequency control value to a second frequency control value utilizing a pseudo-random sequence, the second frequency control value representing a fractional count value when averaged over a time window.

5. The fractional-N synthesized chirp generator of claim 4, wherein the sigma-delta modulator module further comprises a summation block configured to add the second frequency control value and one or more most significant values (N) of the frequency control value, the summation block configured to produce a fractional-N frequency control value having a frequency spectra content that is higher than a loop bandwidth defined by the frequency synthesizer.

6. A fractional-N synthesized chirp generator, comprising: a fractional-N synthesizer comprising a frequency synthesizer and a sigma-delta modulator module, the fractional-N synthesizer configured to receive a reference frequency input signal and a frequency control value, the fractional-N synthesizer configured to transform the reference frequency input signal and the frequency control value to a chirped radio frequency (RF) output signal in a deterministic manner; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time, wherein the sigma-delta modulator module comprises: a first integrator stage comprising a summation block and a register block, the first integrator stage configured to receive one or more lower significant values of the frequency control value; a second integrator stage comprising a summation block, a register block, and a multiplier; a third integrator stage comprising one or more summation blocks, a register block, and a pseudo-random bit sequence generator; a rounding block configured to generate integer values, an output of the rounding block coupled to the summation block of the first integrator stage, to the multiplier, and to one of the one or more summation blocks; and a summation block configured to receive the integer values and one or more most significant values (N) of the frequency control value and configured to produce a second frequency control value.

7. A fractional-N synthesized chirp generator, comprising: a fractional-N synthesizer configured to receive a reference frequency input signal and a frequency control value, the fractional-N synthesizer configured to transform the reference frequency input signal and the frequency control value to a chirped radio frequency (RF) output signal in a deterministic manner; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time, wherein the digital ramp synthesizer comprises a ramp synthesizer block and a ramp controller block, and wherein the ramp controller block comprises: an upper frequency limit block configured to provide an upper frequency limit value; a lower frequency limit block configured to provide a lower frequency limit value; a selector configured to select the upper frequency limit value or the lower frequency limit value based on a counter control value, the selector configured to produce a frequency limit value; and a compare logic block configured to receive the frequency limit value and the frequency control value, the compare logic block configured to produce a counter control value.

8. The fractional-N synthesized chirp generator of claim 7, wherein the reference frequency input signal is variable with time.

9. A fractional-N synthesized chirp generator, comprising: a fractional-N synthesizer configured to receive a reference frequency input signal and a frequency control value, the fractional-N synthesizer configured to transform the reference frequency input signal and the frequency control value to a chirped radio frequency (RF) output signal in a deterministic manner; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time, wherein the digital ramp synthesizer comprises a ramp synthesizer block and a ramp controller block, and wherein the ramp synthesizer block comprises: an up-chirp ramp rate block configured to provide an up-chirp ramp rate; a down-chirp ramp rate block configured to provide a down-chirp ramp rate; a selector configured to select the up-chirp ramp rate or the down-chirp ramp rate based on a counter control value, the selector configured to produce a frequency ramp control value; a frequency divider configured to receive the reference frequency input signal and the frequency ramp control value and configured to produce a counter clock frequency signal based on the reference frequency input signal and the frequency ramp control value; and an up/down counter configured to receive a counter control value, the counter clock frequency signal and an initial count value, the up/down counter configured to produce the frequency control value.

10. The fractional-N synthesized chirp generator of claim 9, wherein the up/down counter is configured to change the frequency control value at a rate determined by a frequency of the counter clock frequency signal, the up/down counter is configured to change the frequency control value by a count increment amount at each time interval, the count increment amount being constant for a given mode of operation, the frequency control value increases in linear steps with time at a first rate determined by the frequency of the counter clock frequency signal during a first time period, the frequency control value decreases in linear steps with time at a second rate determined by the frequency of the counter clock frequency signal during a second time period, the first and second time periods are consecutive, the frequency of the counter clock frequency signal is at a constant value during the first time period, and the frequency of the counter clock frequency signal is at a constant value during the second time period.

11. A fractional-N synthesized chirp generator, comprising: a fractional-N synthesizer configured to receive a reference frequency input signal and a frequency control value, the fractional-N synthesizer configured to transform the reference frequency input signal and the frequency control value to a chirped radio frequency (RF) output signal in a deterministic manner; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time, wherein the digital ramp synthesizer comprises a ramp synthesizer block and a ramp controller block, and wherein the ramp synthesizer block comprises: an up-chirp ramp rate block configured to provide an up-chirp ramp rate; a down-chirp ramp rate block configured to provide a down-chirp ramp rate; a selector configured to select the up-chirp ramp rate or the down-chirp ramp rate based on a counter control value, the selector configured to produce a ramp control value; a frequency divider configured to receive the reference frequency input signal and configured to produce an adder clock frequency signal; and an adder configured to receive the ramp control value, the adder clock frequency signal and an initial count value, the adder configured to produce the frequency control value.

12. The fractional-N synthesized chirp generator of claim 11, wherein the adder is configured to change the frequency control value at each time interval determined by the adder clock frequency signal, and the adder is configured to change the frequency control value by an increment amount determined by the ramp control value.

13. A fractional-N synthesized chirp generator, comprising: a fractional-N synthesizer comprising a frequency synthesizer and a sigma-delta modulator module, the fractional-N synthesizer configured to receive a reference frequency input signal and a frequency control value, the fractional-N synthesizer configured to transform the reference frequency signal and the frequency control value to a chirped radio frequency (RF) output signal in a deterministic manner, the fractional-N synthesizer configured to generate a second frequency control value utilizing a pseudo-random sequence and at least a portion of the frequency control value, the second frequency control value having a frequency spectra content that is higher than a loop bandwidth defined by the frequency synthesizer; and a digital ramp synthesizer configured to receive the reference frequency input signal, the digital ramp synthesizer configured to generate the frequency control value utilizing the reference frequency input signal, the digital ramp synthesizer configured to provide the frequency control value to the fractional-N synthesizer, the frequency control value varying with time; and a control block configured to select an upper frequency limit value or a lower frequency limit value based on a counter control value, configured to produce a frequency limit value, and configured to compare the first frequency control value to the frequency limit value to produce a counter control value.

14. The fractional-N synthesized chirp generator of claim 13, wherein the frequency synthesizer comprises:

a voltage controlled oscillator configured to follow a time-averaged value of the second frequency control value and configured not to follow an instantaneous value of the second frequency control value; and a frequency divider coupled to the voltage controlled oscillator, the frequency divider configured to oscillate between multiple values of the second frequency control value, wherein a response rate of the voltage controlled oscillator is slower than a rate of change of the instantaneous value of the second frequency control value.

15. The fractional-N synthesized chirp generator of claim 2, wherein a one-to-one correspondence exists between the frequency control value and the frequency of the chirped RF output signal.

16. The fractional-N synthesized chirp generator of claim 2, wherein the chirped RF output signal varies linearly with time, the chirped RF output signal increases linearly with time at a first rate during a first time period, the chirped RF output signal decreases linearly with time at a second rate during a second time period, and the first and second time periods are consecutive.

17. The fractional-N synthesized chirp generator of claim 16, wherein the first rate is equal to the second rate.

18. A transmitter integrated circuit comprising the fractional-N synthesized chirp generator of claim 2.

19. A method for generating a chirped radio frequency (RF) output signal, comprising: receiving a reference frequency input signal; generating a first frequency control value utilizing the reference frequency input signal, the first frequency control value varying with time; generating a second frequency control value based on the first frequency control value, the second frequency control value including a pseudo-random sequence, the second frequency control value having a frequency spectra content that is higher than a loop bandwidth defined by a frequency synthesizer, the frequency synthesizer comprising a voltage controlled oscillator, the voltage controlled oscillator not following an instantaneous value of the second frequency control value but following a time-averaged value of the second frequency control value; and generating a chirped radio frequency (RF) output signal utilizing the reference frequency input signal and the second frequency control value; selecting an upper frequency limit value or a lower frequency limit value based on a counter control value; producing a frequency limit value; and comparing the first frequency control value to the frequency limit value to produce a counter control value.

20. The method of claim 19, wherein a response rate of the voltage controlled oscillator is slower than a rate of change of the instantaneous value of the second frequency control value.

21. The method of claim 19, further comprising:

selecting an up-chirp ramp rate or a down-chirp ramp rate based on a counter control value;

producing a frequency ramp control value; and generating a counter clock frequency signal based on the reference frequency input signal and the frequency ramp control value, wherein the first frequency control value is generated based on a counter control value and the counter clock frequency signal.

22. The method of claim 19, further comprising:
selecting an up-chirp ramp rate or a down-chirp ramp rate based on a counter control value;
producing a ramp control value; and
generating an adder clock frequency signal based on the reference frequency input signal,
wherein the first frequency control value is generated based on the ramp control value and the adder clock frequency signal.

* * * * *